United States Patent
Turner

(10) Patent No.: US 6,400,131 B1
(45) Date of Patent: Jun. 4, 2002

(54) TRANSDUCER OFFSET COMPENSATION

(75) Inventor: Michael James Turner, Leeds (GB)

(73) Assignee: Switched Reluctance Drives, Ltd., Harrogate (GB)

(*) Notice: Subject to any disclaimer, the term of this patent is extended or adjusted under 35 U.S.C. 154(b) by 0 days.

(21) Appl. No.: 09/074,854

(22) Filed: May 8, 1998

(30) Foreign Application Priority Data

May 9, 1997 (GB) .............................................. 9709498

(51) Int. Cl.7 .............................................. G01D 18/00
(52) U.S. Cl. ...................................... 324/130; 324/132
(58) Field of Search ........................ 318/490; 250/372; 324/225, 117 H; 310/68 B; 364/176

(56) References Cited

U.S. PATENT DOCUMENTS

| | | | | |
|---|---|---|---|---|
| 3,543,169 A | * | 11/1970 | Hill .............................. 358/171 |
| 3,845,326 A | * | 10/1974 | Godden ...................... 307/230 |
| 3,925,639 A | * | 12/1975 | Hester ..................... 235/61.11 |
| 4,008,398 A | * | 2/1977 | Schramm et al. ........... 250/372 |
| 4,354,200 A | * | 10/1982 | Haenen et al. ................. 358/23 |
| 4,356,446 A | * | 10/1982 | Battocletti ................. 324/83 R |
| 4,371,837 A | * | 2/1983 | Sieverin ..................... 324/225 |
| 4,520,298 A | * | 5/1985 | Abbondanti ................. 318/490 |
| 4,551,754 A | * | 11/1985 | Meise et al. ................. 358/180 |
| 4,688,097 A | * | 8/1987 | Lin .............................. 380/15 |
| 5,028,876 A | * | 7/1991 | Cadwell ..................... 324/678 |
| 5,057,920 A | * | 10/1991 | Wilkinson ................... 358/171 |
| 5,805,448 A | * | 9/1998 | Lindsay et al. ............. 364/176 |
| 5,821,648 A | * | 10/1998 | Allinson .................. 310/68 B |

FOREIGN PATENT DOCUMENTS

| | | |
|---|---|---|
| EP | 0 360 348 A2 | 3/1990 |
| JP | 2-141673 | 5/1990 |
| JP | 04184267 | 7/1992 |

* cited by examiner

Primary Examiner—Safet Metjahic
Assistant Examiner—Jimmy Nguyen
(74) Attorney, Agent, or Firm—Dicke, Billig & Czaja, P.A.

(57) ABSTRACT

A transducer circuit, particularly for monitoring current, compensates for offset in the transducer output by sampling the output periodically at a moment at which the output is known, and storing the sampled value as an offset. The offset is compared with subsequent outputs from the transducer to provide a difference signal which is the compensated output of the transducer. When the calibrated output of the transducer is non-zero at the said moment, the non-zero value is added as a reference to the compensated value to correct the magnitude of the transducer output.

36 Claims, 4 Drawing Sheets

TRANSDUCER OFFSET COMPENSATION

BACKGROUND OF THE INVENTION

1. Field of the Invention

This invention relates to offset compensation of the output of a transducer. The invention is particularly, though not exclusively, applicable to offset compensation in current measurement in the control of a switched reluctance machine.

2. Description of Related Art

Many electrical and electronic systems require transducers for converting a parameter into an electrical signal. For example, electric motors and generators require some means of monitoring current for a variety of well-recognized reasons, such as measurement, control and equipment protection. A simple technique for doing this is to derive a signal indicative of the current from the voltage dropped across a series-connected resistor in accordance with Ohm's law. This is a simple technique, but it has various drawbacks. Firstly, the resistor will have a non-zero temperature coefficient of resistance. It generates heat by virtue of the current flowing through it, which will distort the reading when it is used at a temperature other than that at which it is calibrated, due to its non-zero temperature coefficient of resistance. Secondly, the resistor must be connected directly in the circuit to be monitored. This alone makes resistance current monitoring impracticable in, for example, power circuits in which the current to be monitored is in a circuit at a high potential with respect to the circuit to which the monitored current signal is to be relayed. Thirdly, connecting the resistor in the monitored circuit may distort the operation of the circuit itself to an unacceptable degree.

The problem in relatively high potential circuits has been addressed by electrically isolating the circuit being monitored from the monitoring circuit itself. However, the need for isolation raises the further problem that the potential across the isolation barrier may change very rapidly. A typical example of this is in semiconductor switching circuits in which rapid changes in voltage in the monitored circuit occur as a result of switching. The large rate of change of voltage with respect to time (dV/dt) in the monitored circuit can cause capacitive current flow, induced across the isolation boundary, creating a further opportunity for corruption of the transducer output signal.

Current transformers (CT's) are a form of transducer by which a measure of current in a conductor can be derived. They are electrically isolated from the conductor itself and they have found extensive use in the field of electrical power engineering as, for example, monitors in current regulation and protection systems.

A known CT relies on the substantial balance of magnetomotive force (MMF) between primary and secondary windings that would exist in a CT using a high permeability core. Ideally, a zero secondary circuit impedance ("burden") would mean that this balance condition would be achieved at zero core flux. In practice, however, the non-zero burden dictates that a voltage will be dropped across the secondary winding with the result that the core flux will also be non-zero.

The core flux is proportional to the integral of the secondary voltage. In the case of an alternating waveform, the amplitude of the core flux will therefore be inversely proportional to the frequency of the monitored current. In addition, the finite permeability of a real core requires MMF to drive the flux around the core. Assuming a linear response of the magnetic material of the core, this MMF will be directly proportional to the flux. As the core flux increases, a larger MMF will be needed to support it. Thus, with decreasing frequency the CT core absorbs an increasing proportion of the primary MMF. Therefore, the secondary MMF and the output current must fall.

It has been considered that this fall-off in the lower frequency response of CT's represents an operating limit on their usefulness. A low frequency CT means both a large core and a low secondary impedance to offer a flat frequency response over a specified working frequency range. In the limit, known CT's cannot operate at dc (zero frequency) because of the non-zero secondary circuit resistance which is present in practice.

To address the problem of measuring current at low frequencies and at dc, current measuring devices have been developed that rely on the Hall effect. These are responsive to the strength of the magnetic field created by the current to be monitored. They are also often referred to in the art as "current transformers" although transformer principles are not involved.

A known current transducer based on the Hall effect uses a Hall-effect device arranged in an air gap in an otherwise toroidal core. The conductor carrying the current to be monitored is arranged to pass through the central aperture of the toroid. The Hall-effect device in the gap measures directly the flux resulting from the introduction of MMF in the core due to the current in the conductor.

While the device is relatively simply constructed, it has some disadvantages. Firstly, the response of the core material is not linear in practice. Secondly, the Hall-effect device also has a non-linear response and displays characteristics which introduce a static offset error into measurements. Furthermore, the small amplitude of the Hall voltage at the output of the device requires relatively large gain amplification which may render the monitoring circuit as a whole unacceptably prone to noise.

In general, the open-loop Hall-effect element tends to exhibit inconsistency in its output offset characteristics. That is, the output can be expressed as $(k*I)+c$, where c is a non-constant offset term. The value of c may vary significantly from transducer to transducer, and may also vary with time, temperature, supply voltage and other factors. This can be a significant deterrent to using what would otherwise be an attractive, low-cost solution. For example, one manufacturer offers a range of current sensors based on their Hall-effect device, but the output offset voltage of their low-cost unit varies by ±10% initially, is proportional to supply voltage and exhibits a temperature coefficient of ±0.05% per Kelvin. The initial offset can be trimmed out, but the temperature and supply-dependent offset variations may be less easy to deal with.

Feedback has been used in conjunction with a CT and a Hall-effect element. In this arrangement the problem of the secondary voltage in a CT is addressed by controlling a secondary current with an amplifier having an input which is a negative feedback signal from the Hall-effect element proportional to core flux. The secondary MMF is then independent of burden voltage and can be made to follow the MMF due to the current in the conductor closely by adjusting the product of the gain of the feedback amplifier and core permeability. With very large amplifier gain, the balance between the primary and secondary MMF's is determined only by the offset null of the Hall-effect element. Core linearity becomes largely irrelevant because the feedback action is always such as to maintain zero flux and thus to balance the MMF's. The ratio of primary to secondary current is, therefore, determined by the transformer turns ratio only.

Such transducers of the "flux-nulling" Hall-effect type have been popular in the electric machine control field (for example on switched reluctance motors and generators) because of their dc response, wide bandwidth and small size. An example of the flux-nulling sensor is one manufactured by LEM s.a. of Geneva, Switzerland. These sensors are non-invasive and electrically isolated from the monitored current. However, they are relatively expensive because they need an accurately zeroed Hall-effect element and fast responding amplifiers.

SUMMARY OF THE INVENTION

It is an object of the present invention to provide offset compensation for a transducer or a transducer circuit that is both inexpensive and does not require the complexity of the closed loop solutions referred to above.

According to an embodiment of the invention there is provided a transducer circuit comprising a transducer operable to produce an electrical transducer output signal indicative of the magnitude of a monitored parameter, sampling means for sampling the transducer output signal at a moment corresponding to a known value of the parameter, the sampling means providing an offset signal which is equivalent to the transducer signal at the said moment, and a differencer arranged to receive a subsequent transducer output signal and the offset signal and to produce a compensated output which is the difference between the subsequent transducer output and at least the offset signal.

Embodiments of the invention require knowledge of the moment at which the monitored magnitude of the parameter will be at a known value, or knowledge of the value of the parameter at a known moment. The compensation applied takes account of any deviation in the output from the transducer with respect to the known value of the parameter and adjusts the transducer output automatically.

The invention is particularly useful in situations in which the known value of the parameter is zero (typically zero current for zero output from an ideal Hall-effect element). However, adjustment for non-zero outputs from the transducer corresponding to the known value can be effected by including an adder in the circuit which is arranged in relation to the differencer such that a reference signal corresponding to the said known value of the parameter is added to the compensated output.

Preferably, the sampling means comprises a sample and hold circuit. This is desirably a combination of a switch gating the output of the transducer to a storage capacitor. The output of the transducer is supplied to the capacitor to store the transducer output signal at the said moment.

Alternatively, the sampling means may include an analog to digital converter (ADC) which is operable, in response to an actuating signal at the said moment, to derive the offset signal in the form of a digital word from the transducer signal. In this digital implementation of the invention it is preferable that the digital word is stored in a digital word store which supplies the digital word to the differencer.

In the case of the offset compensation by deriving an offset compensation signal from a non-zero output of the transducer, the adder may be a digital adder to which the reference signal is applied in digital form. The output of the adder may be supplied to a digital-to-analog converter (DAC), providing an analog signal indicative of the addition of the offset digital word and the reference digital word. This may then be applied to the differencer together with the offset compensation signal. In an alternative form, the differencer is a digital differencer which is operable to derive a digital form of compensated output.

The invention extends to a method of compensating for offset in the output of an electrical transducer producing an electrical transducer signal in response to a monitored parameter, the method comprising: sampling the transducer output signal at a moment corresponding to a known value of the parameter, and taking the difference between a subsequent transducer output signal and the sample transducer output signal to produce a compensated output.

The method may include adding a reference signal to the compensated output that corresponds to the correct transducer output for the said known value of the parameter at the said moment. This is particularly useful in those cases where the known value of the parameter is non-zero.

The invention also extends, in a particular form, to a switched reluctance drive system comprising a switched reluctance machine having a rotor and a stator and at least one stator winding, switch means connected with the stator winding and being actuatable to control the energy in the winding, and a controller operably connected to actuate the switch means, the controller comprising timing means from which timing signals are derived for actuating the switch means, and a transducer circuit arranged to monitor the current in the winding which current has a known value during a recurring interval, the transducer circuit comprising a current transducer responsive to current in the winding to produce an electrical transducer output signal indicative of the monitored current, sampling means for sampling the transducer signal at a moment coincident with the known current, the sampling means providing an offset signal which is equivalent to the transducer signal at the said moment, a differencer arranged to receive a subsequent transducer output signal and the offset signal and to produce a compensated output which is the difference between the subsequent transducer output signal and at least the offset signal.

Preferably, in switched reluctance machine control, a cyclically recurring interval of zero-current can be used as the known current. Particular advantage of this zero-current interval is taken in embodiments of the invention because it allows regular offset compensation without recourse to a reference signal input by sampling the output from the current transducer during the zero-current interval.

Preferably, the transducer includes a Hall-effect element. Preferably, a simple circuit can be used including the Hall-effect element, or any other transducer connected in an open-loop arrangement.

BRIEF DESCRIPTION OF THE DRAWINGS

The invention can be put into practice in various ways, some of which will now be described by way of example with reference to the accompanying drawings, in which.

DETAILED DESCRIPTION OF PREFERRED EMBODIMENTS

Figure 1:
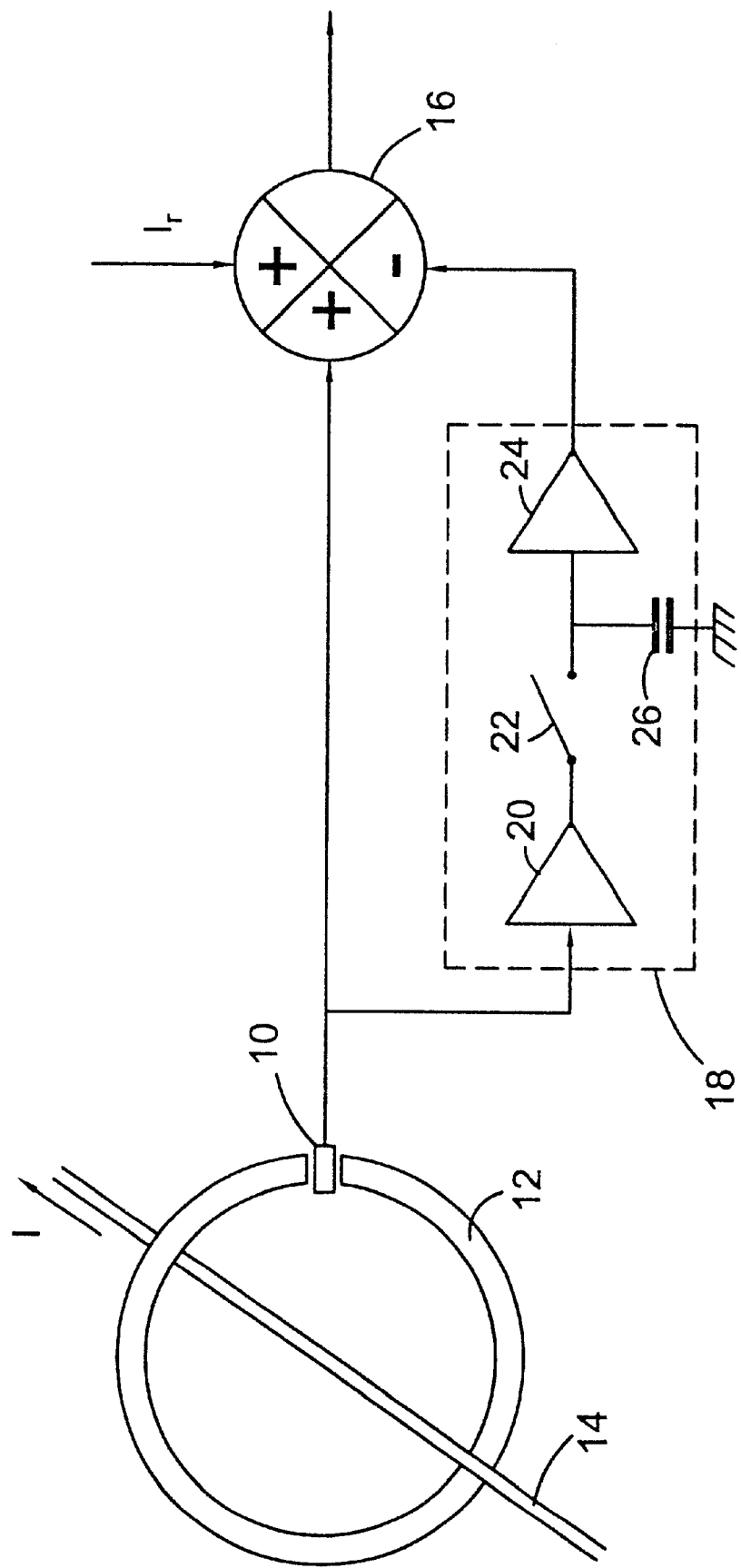
FIG. 1 is a schematic circuit diagram of a first embodiment of the invention.

A current sensor is shown in FIG. 1 comprising a Hall-effect element 10 which is arranged in the air gap of a ferromagnetic toroidal ring 12. The ring 12 embraces a conductor 14 carrying the current I which is the parameter to be monitored in this embodiment.

The output of the Hall-effect element 10 is described above as (k*I)+c, where c is a non-constant offset term. This output is connected to the non-inverting input of a differencing circuit 16. In parallel with this, the output of the Hall-effect element 10 is also connected with a sample and hold circuit 18 comprising a first buffer amplifier 20, a sampling switch 22 and a second buffer amplifier 24 all connected in series and forming a parallel connection of the Hall-effect element output to the inverting input of the differencing circuit 16. A holding capacitor 26 is connected between the sampling switch 22 and the second buffer amplifier 24 to ground. A third input $I_r$ to a non-inverting input of the differencing circuit 16 is a reference signal corresponding to the calibrated output of the transducer indicative of the known current at a predetermined moment.

FIG. 1 represents an analog implementation of the invention. By closing the switch 22 momentarily, but for sufficient time to charge the capacitor 26, the sample and hold circuit 18 is effectively updated with the output from the Hall-effect element 10. Considering, first of all, that the output of the Hall-effect element 10 for zero current at a known moment at which the sample is taken will comprise only the offset term c, the difference between the updated offset signal stored in the sample and hold circuit 18 and any subsequent output from the transducer is automatically compensated for drift or offset present in the output.

In the case of a non-zero output from the transducer corresponding to the known value at the particular moment, the calibrated output of the transducer as it should be without drift is applied as the reference signal $I_r$ to be added to the result of the difference between the subsequent transducer output and the stored offset signal.

The scheme uses prior knowledge of the current to be measured at a particular moment to derive the offset signal from the actual output of the transducer. This allows any offset to be eliminated.

Figure 2:
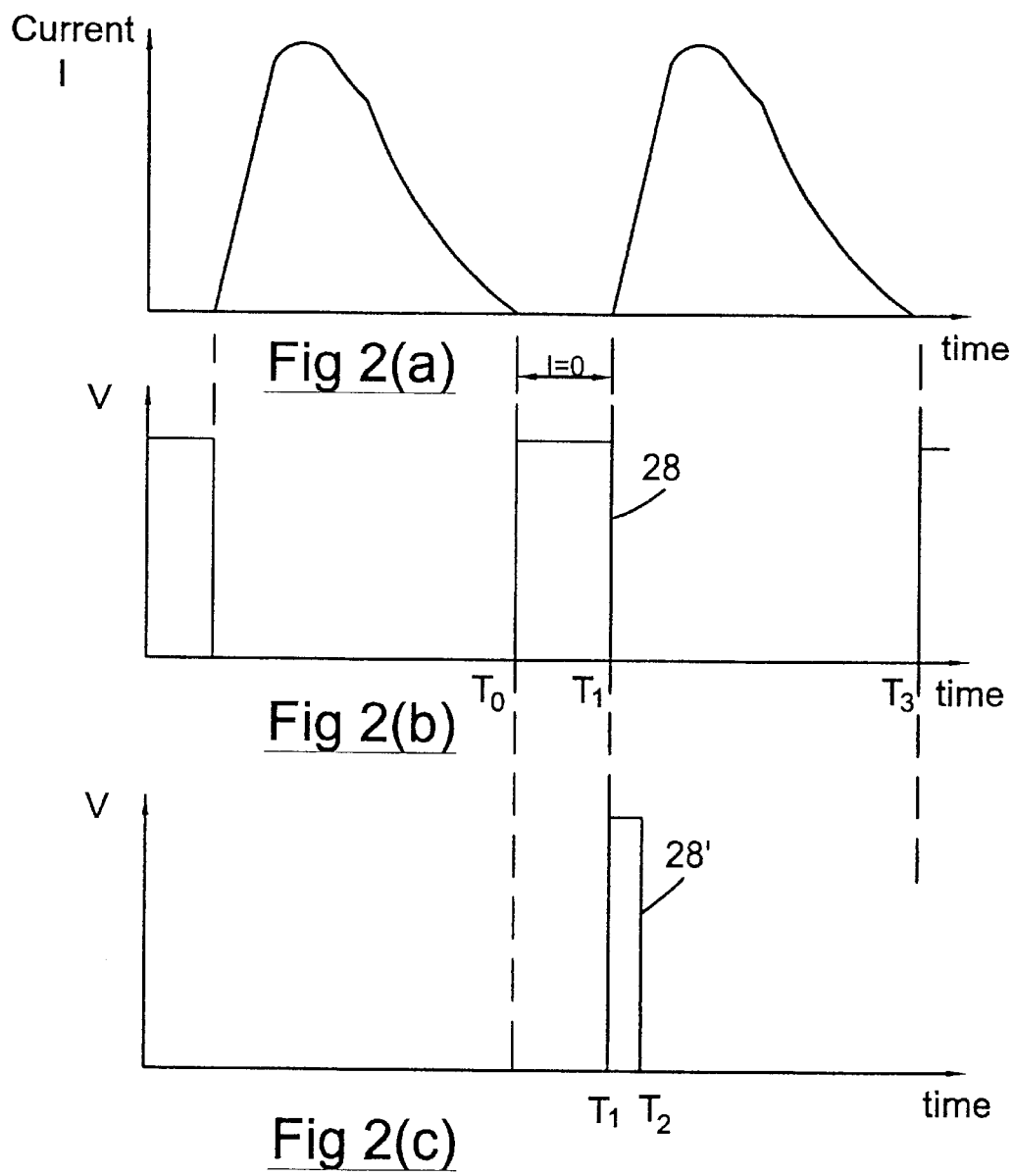
FIG. 2 is a waveform diagram illustrating winding current in the windings of a switched reluctance machine, according to an embodiment of the invention.

FIG. 2(a) shows a phase winding current waveform (I) in a switched reluctance motor, where embodiments of the invention can be applied to advantage. By virtue of constraints on the energization timing (as is usual for a switched reluctance machine), the phase current I at the end of each electrical cycle is known to be zero when the motor is run in a discontinuous phase current mode of operation. At these known zero current points, the switch 22 is momentarily closed by means of an actuation signal pulse 28, thus storing the offset as a voltage (corresponding to zero current) in the capacitor 26. The actuation pulse 28 is shown in FIG. 2(b). Since, in a typical switched reluctance system, the time $T_0$ is not necessarily known to the central system but $T_1$ (the instant at which the phase winding is re-energized) is known, it may be convenient to employ an actuation pulse 28', as shown in FIG. 2(c), beginning at $T_1$ and ending a short time thereafter at $T_2$. Since in a typical switched reluctance machine the period of the phase current cycle (i.e. $T_3-T_0$) may be comparatively short (e.g. several milliseconds), the error introduced by opening the switch 22 after the interval of zero current (i.e. $T_0$ to $T_1$) will be small.

The offset voltage is subtracted from the subsequent sensor output, so giving a more accurate current measurement compensated for offset. Providing the offset is sampled often enough, offset drift due to temperature and supply voltage variations will be largely canceled. Only the variation over a sample interval will remain. In the case of a switched reluctance machine, the current at the moment in question is known to be zero. Therefore, this embodiment of the invention does not require a bias input to the comparator indicative of the reference current $I_r$ at the predetermined moment.

Figure 3:
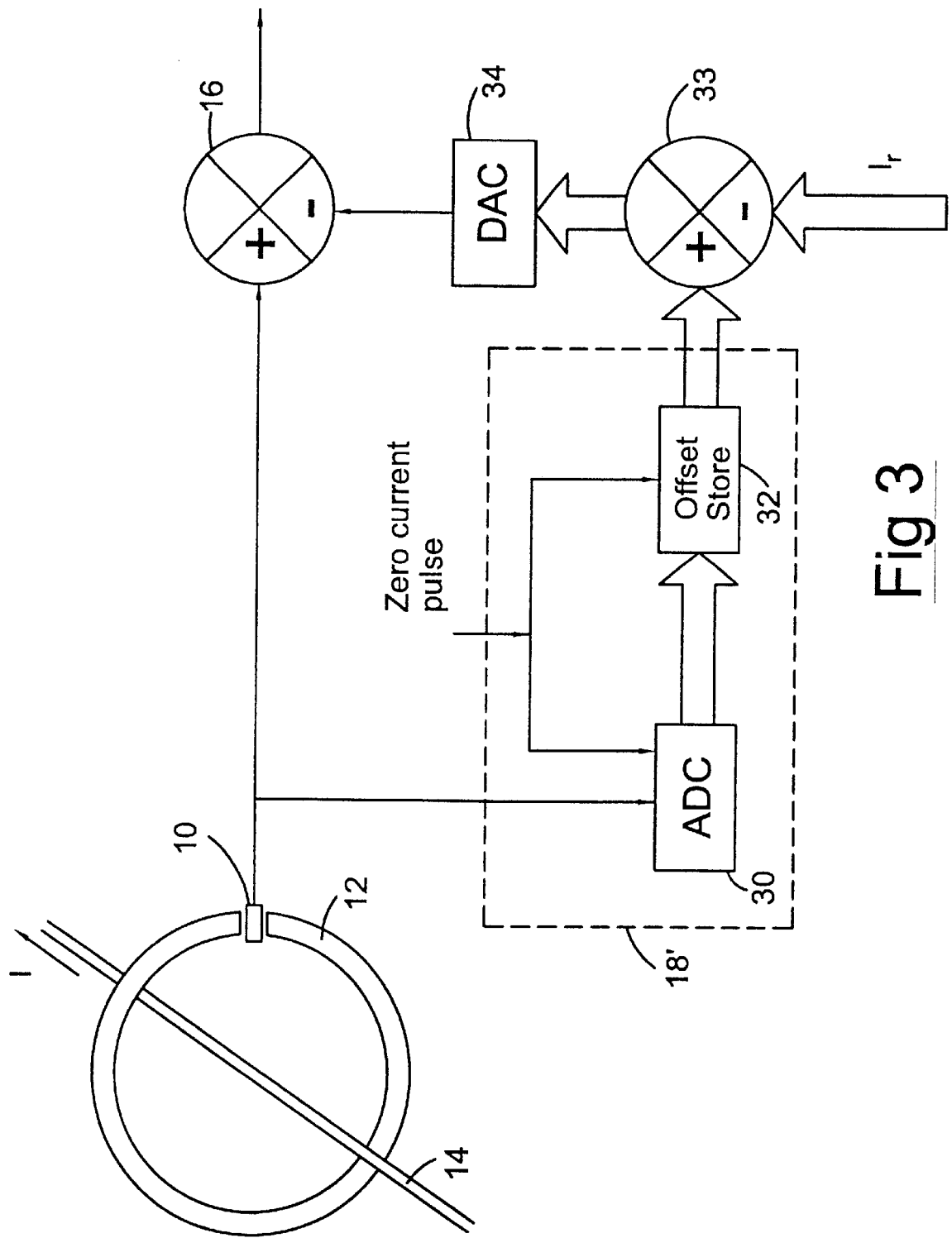
FIG. 3 is a schematic circuit diagram of a second embodiment of the invention.

In FIG. 3 a partly digital implementation of the invention is shown. The output from the Hall-effect element 10 is applied to a digital sample and hold circuit 18' comprising an analog-to-digital converter (ADC) 30, the digital offset word being stored in an offset store 32. A digital version of the current reference word $I_r$ representing the known current at the predetermined moment is subtracted from the offset word being stored in the store 32 in a digital subtractor 33. The difference between the offset word and the current reference word $I_r$ represented by the output of the subtractor 33 is applied to a digital-to-analog convertor (DAC) 34 and the analog output from the DAC 34 is applied to the inverting input to the analog differencing circuit 16 where it is subtracted from the output of the Hall-effect element 10. As before, the output of the differencing circuit 16 is the offset adjusted (compensated) signal from the Hall-effect element 10 indicative of the monitored current. As with the fully analog implementation of the invention, the sample and hold circuit 18' is caused to take a sample of the output of the Hall-effect element 10 by means of the pulse 28 at the zero current points. This also loads the uncompensated word in the offset store 32.

The reference current $I_r$ is generated digitally, then the difference between the word in the offset store and $I_r$ is compared with the actual value in the analog domain. This is likely to be necessary in some applications of switch-based electrical regulation where a software-based, fully digital output may be too slow to implement the actual current control. In the context of a controller for a switched reluctance machine, the phase winding current is part of the information fed back by which the controller effects its algorithmic control regime. Because the current feedback signal is driven by the difference between the output of the Hall-effect element 10 and the output of the DAC 34, adding the offset to the negated reference signal is equivalent to subtracting it from the Hall-effect element output. This arrangement offers the advantage that the sample and hold circuit 18' and the subtractor 33 can be implemented entirely in software. It does require an analog-to-digital converter, but this need only update the offset word relatively infrequently, so a high-performance converter is not required in many applications. Many systems will have an ADC channel available for such purposes. Microcontrollers sometimes have built-in multichannel ADC's which could usefully be exploited in embodiments of this invention.

The invention provides a low-cost monitoring system offering reduced offset drift. It also eliminates the need for initial trimming of the offset parameter for individual transducers, amplifiers, etc. It makes use of intervals where the waveform is known to have a particular value, and is therefore well-suited to use in a switched reluctance drive.

Figure 4:
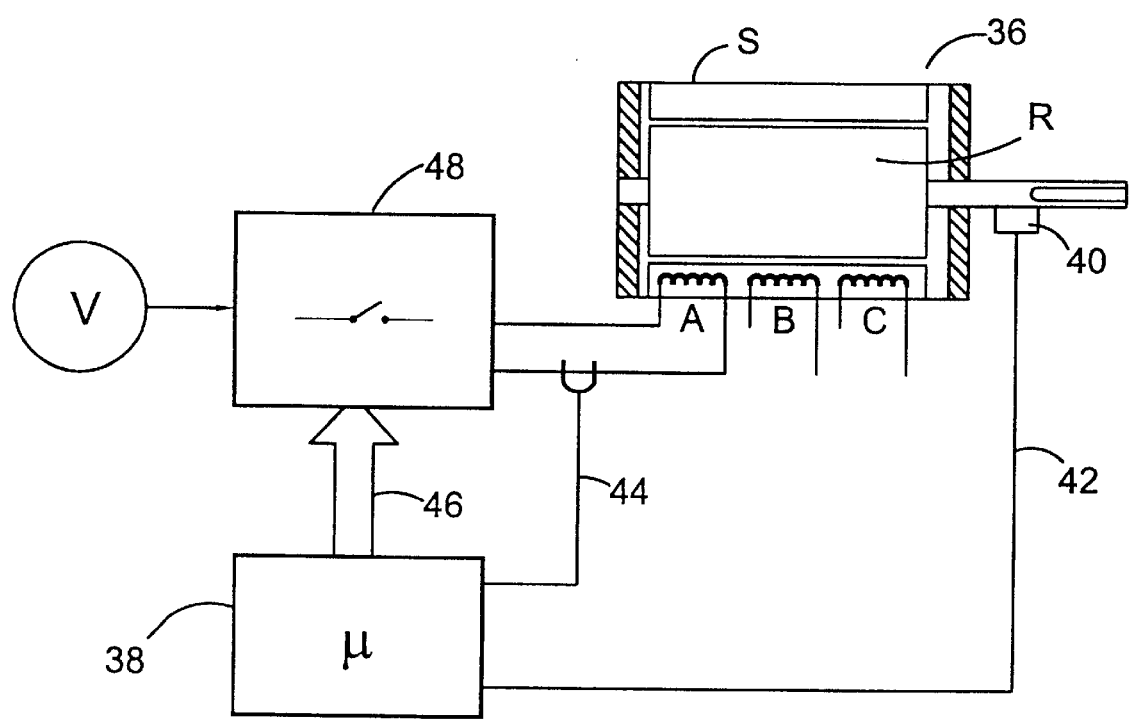
FIG. 4 is a schematic diagram of a switched reluctance drive system according to an embodiment of the invention.

FIG. 4 illustrates a switched reluctance drive in which an embodiment of the invention is implemented. It comprises a three-phase switched reluctance machine 36 which, for the sake of illustration, will be described in terms of a motor. The machine has phase windings A, B and C, a rotor R and stator S. In this much simplified illustration the machine 36 is controlled by a microprocessor-based controller 38 which receives feedback signals from a rotor position transducer 40, as is well known in the art, and phase current information from the Hall-effect element 10 on lines 42 and 44, respectively. According to known control strategies, the controller 38 generates firing signals on lines 46 which control the actuation of conventional switch apparatus 48 applying voltage to the phase windings from an electrical source V. In this embodiment the reference timing derived by the controller 38 to actuate the switches is also used to determine the moments at which the current in one of the phase windings will be zero. It is at this calculated moment that the offset reading, in either analog or digital form, is taken by sampling the output of the Hall-effect element 10. The zero-current moments will recur frequently as the rotor of the motor rotates, so allowing the offset value or word to be updated before significant drift from the last compensation was made.

It will be clear to the person skilled in the art that embodiments of this invention are applicable to any transducer that is subject to drift or other offset from a calibrated condition over time. The invention is particularly applicable to, for example, electrical machines in which a known value of the monitored parameter will recur regularly and, preferably, periodically according to a known cycle. However, it is equally applicable to other transducers measuring other parameters in which there is a need for output offset compensation. Accordingly, the principles of the present invention, which have been disclosed by way of the above examples and discussion, can be implemented using various circuit types and arrangements and can be applied in different ways. Those skilled in the art will readily recognize that these and various other modifications and changes may be made to the present invention without strictly following the exemplary applications illustrated and described herein and without departing from the true spirit and scope of the present invention which is set forth in the following claims.

What is claimed:

1. A current transducer circuit comprising a current transducer for producing an output signal indicative of the magnitude of a monitored current, sampling means for sampling the current transducer output signal at a moment corresponding to a known value of the magnitude of the current, the sampling means being arranged to store the sampled output signal as an offset signal, the circuit further comprising a differencer arranged to receive at least a subsequent current transducer output signal and the offset signal and to produce a compensated output which is the difference between the subsequent current transducer output signal and at least the offset signal, wherein the sampling means is adapted to sample the current transducer output signal at a moment corresponding to substantially zero current.

2. A circuit as claimed in claim 1 in which the sampling means comprises a sample and hold circuit, the sample and hold circuit being operable to sample the transducer output signal at the said moment and to hold the sampled output as the offset signal.

3. A circuit as claimed in claim 1, including an adder arranged to receive the output of the sampling means and a reference signal corresponding to a calibrated output of the transducer at the said moment and to produce an output in the form of a sum of the output of the sampling means and the reference signal, the differencer being arranged to receive the output of the adder and to produce the compensated output which is the difference between the subsequent transducer output signal and the said sum.

4. A circuit as claimed in claim 2 in which the sampling means comprises a gating device and a storage capacitor, the gating device being operable at the said moment to enable the transducer output to be applied to the storage capacitor and stored therein as the offset signal.

5. A circuit as claimed in claim 2 in which the sampling means comprises an analog-to-digital converter (ADC) and a digital word store arranged to receive the output of the ADC, the ADC being operable, in response to an actuating signal, to convert the transducer output at the said moment into a digital word, the digital word being storable in the digital word store as the offset signal.

6. A circuit as claimed in claim 5 in which a subtractor is arranged to find a difference between the offset signal in the form of an offset word and a reference signal in the form of a reference word, the circuit further including a digital-to-analog converter (DAC) arranged to convert the said difference into an analog difference and to transmit the analog difference to the differencer.

7. A circuit as claimed in claim 1 in which the current transducer comprises a Hall-effect element.

8. An electrical machine drive system comprising an electrical machine, a machine controller and a current transducer for producing an output signal indicative of the magnitude of a monitored current of the machine, the controller including a sampling device for sampling the current transducer output signal at a moment corresponding to a known value of the magnitude of the current, the sampling device being arranged to store the sampled output signal as an offset signal, the controller further comprising comprising a first differencer arranged to receive at least a subsequent current transducer output signal and the offset signal and to produce a compensated output which is the first difference between the subsequent current transducer output signal and at least the offset signal, wherein the electrical machine is a switched reluctance machine operable according to a phase inductance cycle and the controller is operable to enable the sampling device during the phase inductance cycle of the electrical machine.

9. A system as claimed in claim 8 in which the sampling device comprises a sample and hold circuit, the sample and hold circuit being operable to sample the transducer output signal at the said moment and to hold the sampled output as the offset signal.

10. A system as claimed in claim 8 including a second differencer arranged to receive the output of the sampling device and a reference signal corresponding to the transducer output signal at the said moment and to produce an output in the form of a second difference between the output of the sampling device and the reference signal, the first differencer being arranged to receive the output of the second differencer and to produce the compensated output which is the difference between the subsequent transducer output signal and the second difference.

11. A system as claimed in claim 9 in which the sampling device comprises a gating device and a storage capacitor, the gating device being operable at the said moment to enable the transducer output to be applied to the storage capacitor and stored therein as the offset signal.

12. A system as claimed in claim 9 in which the sampling device comprises an analog-to-digital converter (ADC) and a digital word store arranged to receive the output of the ADC, the ADC being operable, in response to an actuating signal, to convert the transducer output at the said moment into a digital word, the digital word being storable in the digital word store as the offset signal.

13. A system as claimed in claim 12 in which a subtractor is arranged to find a difference between the offset signal in the form of an offset word and a reference signal in the form of a reference word, the circuit further including a digital-to-analog converter (DAC) arranged to convert the said difference into an analog difference and to transmit the analog difference to the differencer.

14. A system as claimed in claim 8 in which the transducer is arranged to monitor current to provide a signal indicative of winding current in a winding of the switched reluctance machine, the said moment coinciding with an interval of substantially zero current in the winding.

15. A method of compensating for offset in the output of a current transducer, the method comprising:
sampling an output signal from the current transducer at a moment corresponding to a known value of the magnitude of a current monitored by the current transducer;
storing the sampled output signal as an offset signal; and
taking he difference between at least a subsequent current transducer output signal and the offset signal to produce a compensated output which is the difference between the subsequent current transducer output signal and at least the offset signal;
wherein the sampling occurs at a moment corresponding to substantially zero current.

16. A method as claimed in claim 15 including gating the transducer output signal at the said moment and storing the said transducer output signal in a storage capacitor.

17. A method as claimed in claim 15, including subtracting a reference signal corresponding to the output of the transducer at the said moment from the offset signal to produce an output in the form of a second difference and taking the difference between the subsequent transducer output signal and the second difference.

18. A method as claimed in claim 15, including converting the output of the transducer at the said moment into a digital word and storing the digital word in a digital word store as an offset word.

19. A method as claimed in claim 18 in which the output is in the form of a digital word produced by subtracting the reference signal in the form of a reference word from the offset word, and the digital word is converted into an analog signal, the difference taken being the difference between the subsequent transducer output signal and the analog signal.

20. A method as claimed in claim 15 in which the current is in a switched reluctance machine and the monitored current provides a signal indicative of winding current in the machine.

21. A system as claimed in claim 8 in which the sampling device is adapted to sample the current transducer output signal at a moment corresponding to substantially zero current.

22. An electrical machine drive system comprising an electrical machine, a machine controller and a current transducer for producing an output signal indicative of the magnitude of a monitored current of the machine, the controller including a sampling device for sampling the current transducer output signal at a moment corresponding to a known value of the magnitude of the current, the sampling device being arranged to store the sampled output signal as an offset signal, the controller further comprising a first differencer arranged to receive at least a subsequent current transducer output signal and the offset signal and to produce a compensated output which is the first difference between the subsequent current transducer output signal and at least the offset signal, wherein the sampling device is adapted to sample the current transducer output signal at a moment corresponding to substantially zero current.

23. A system as claimed in claim 22 in which the sampling device comprises a sample and hold circuit, the sample and hold circuit being operable to sample the transducer output signal at the said moment and to hold the sampled output as the offset signal.

24. A system as claimed in claim 22 including a second differencer arranged to receive the output of the sampling device and a reference signal corresponding to the transducer output signal at the said moment and to produce an output in the form of a second difference between the output of the sampling device and the reference signal, the first differencer being arranged to receive the output of the second differencer and to produce the compensated output which is the difference between the subsequent transducer output signal and the second difference.

25. A system as claimed in claim 23 in which the sampling device comprises a gating device and a storage capacitor, the gating device being operable at the said moment to enable the transducer output to be applied to the storage capacitor and stored therein as the offset signal.

26. A system as claimed in claim 23 in which the sampling device comprises an analog-to-digital converter (ADC) and a digital word store arranged to receive the output of the ADC, the ADC being operable, in response to an actuating signal, to convent the transducer output at the said moment into a digital word, the digital word being storable in the digital word store as the offset signal.

27. A system as claimed in claim 26 in which a subtractor is arranged to find a difference between the offset signal in the form of an offset word and a reference signal in the form of a reference word, the circuit further including a digital-to-analog converter (DAC) arranged to convert the said difference into an analog difference and to transmit the analog difference to the differencer.

28. A system as claimed in claim 22 in which the electrical machine is a switched reluctance machine operable according to a phase inductance cycle and the controller is operable to enable the sampling device during the phase inductance cycle of the electrical machine.

29. A system as claimed in claim 28 in which the transducer is arranged to monitor current to provide a signal indicative of winding current in a winding of the switched reluctance machine, the said moment coinciding with an interval of substantially zero current in the winding.

30. A method of compensating for offset in the output of a current transducer, the current transducer including a Hall-effect element monitoring current in a conductor, the method comprising:
sampling an output signal from the current transducer at a moment conrresponding to a known value of the magnitude of a current monitored by the current transducer;
storing the sampled output signal as an offset signal; and
taking the difference between at least a subsequent current transducer output signal and the offset signal to produce a compensated output which is the difference between the subsequent current transducer output signal and at least the offset signal.

31. A method as claimed in claim 30 including gating the transducer output signal at the said moment and storing the said transducer output signal in a storage capacitor.

32. A method as claimed in claim 30, including subtracting a reference signal corresponding to the output of the transducer at the said moment from the offset signal to produce an output in the form of a second difference and taking the difference between the subsequent transducer output signal and the second difference.

33. A method as claimed in claim 30, including converting the output of the transducer at the said moment into a digital word and storing the digital word in a digital word store as an offset word.

34. A method as claimed in claim 33 in which the output is in the form of a digital word produced by subtracting the reference signal in the form of a reference word from the offset word, and the digital word is converted into an analog signal, the difference taken being the difference between the subsequent transducer output signal and the analog signal.

35. A method as claimed in claim 30 in which the current is in a switched reluctance machine and the monitored current provides a signal indicative of winding current in the machine, the said moment coinciding with an interval of substantially zero current in the winding.

36. A method as claimed in claim 30 in which the sampling occurs at a moment corresponding to substantially zero current.

\* \* \* \* \*

UNITED STATES PATENT AND TRADEMARK OFFICE
CERTIFICATE OF CORRECTION

PATENT NO.    : 6,400,131 B1
DATED         : June 4, 2002
INVENTOR(S)   : Michael James Turner It is certified that error appears in the above-identified patent and that said Letters Patent is hereby corrected as shown below:

<u>Title page,</u>
References Cited, the following references have been added:
-- 5,105,276 A * 04/1992 Schrock..........................358/213.16 --
-- 5,479,096 A * 12/1995 Szczyrbak et al ..................324/132 --
-- 5,371,552 A * 12/1994 Brummette et al..................348/697 --
-- 5,157,359 A * 11/1992 Nogami et al.....................332/117 --
-- 5,142,354 A * 08/1992 Suzuki et al.....................358/34 --

<u>Column 9,</u>
Line 12, "he" has been change to -- the --.

<u>Column 10,</u>
Line 19, "convent" has been changed to -- convert --.

Signed and Sealed this

Eighth Day of October, 2002

Attest:

Attesting Officer

JAMES E. ROGAN
*Director of the United States Patent and Trademark Office*